(12) United States Patent
Zambrano

(10) Patent No.: US 6,737,284 B2
(45) Date of Patent: May 18, 2004

(54) CONTACT STRUCTURE FOR SEMICONDUCTOR DEVICES AND CORRESPONDING MANUFACTURING PROCESS

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 10 days.

(21) Appl. No.: 10/263,361

(22) Filed: Oct. 1, 2002

(65) Prior Publication Data

US 2003/0082873 A1 May 1, 2003

Related U.S. Application Data

(62) Division of application No. 10/033,508, filed on Dec. 28, 2001, now Pat. No. 6,541,808, which is a continuation of application No. 09/417,030, filed on Oct. 12, 1999, now abandoned.

(30) Foreign Application Priority Data

Oct. 12, 1998 (EP) .......................... 988305598

(51) Int. Cl.⁷ .............................................. H01L 21/00
(52) U.S. Cl. ......................... 438/3; 438/239; 438/253; 438/250
(58) Field of Search ........................... 438/3, 239, 253, 438/250

(56) References Cited

U.S. PATENT DOCUMENTS

| | | | | |
|---|---|---|---|---|
| 5,475,248 A | 12/1995 | Takenaka | | 257/295 |
| 5,481,490 A | 1/1996 | Watanabe et al. | | 365/145 |
| 5,578,867 A | 11/1996 | Argos, Jr. et al. | | 257/632 |
| 5,638,319 A | 6/1997 | Onishi et al. | | 365/145 |
| 5,716,875 A | 2/1998 | Jones, Jr. et al. | | 438/3 |
| 5,750,419 A | 5/1998 | Zafar | | 438/3 |
| 5,811,847 A | 9/1998 | Joshi et al. | | 257/296 |
| 5,864,153 A | 1/1999 | Nagel et al. | | 257/296 |
| 5,944,153 A | 8/1999 | Ichimaru | | 438/3 |
| 5,953,619 A | * 9/1999 | Miyazawa et al. | | 438/396 |
| 5,956,594 A | 9/1999 | Yang et al. | | 438/396 |
| 5,965,942 A | 10/1999 | Itoh et al. | | 257/761 |
| 5,973,342 A | 10/1999 | Nakamura | | 257/295 |
| 5,981,382 A | 11/1999 | Konecni et al. | | 438/646 |
| 5,990,507 A | 11/1999 | Mochizuki et al. | | 257/295 |
| 5,998,296 A | 12/1999 | Saran et al. | | 438/685 |
| 6,037,252 A | 3/2000 | Hillman et al. | | 438/637 |
| 6,043,529 A | 3/2000 | Hartner et al. | | 257/306 |
| 6,051,858 A | 4/2000 | Uchida et al. | | 257/295 |
| 6,075,264 A | 6/2000 | Koo | | 257/295 |
| 6,091,599 A | 7/2000 | Amamiya | | 361/306.3 |
| 6,121,083 A | 9/2000 | Matsuki | | 438/254 |
| 6,180,974 B1 | 1/2001 | Okutoh et al. | | 257/306 |
| 6,194,311 B1 | 2/2001 | Nakajima | | 438/660 |
| 6,197,631 B1 | 3/2001 | Ishihara | | 438/240 |
| 6,239,460 B1 | 5/2001 | Kuroiwa et al. | | 257/300 |
| 6,281,537 B1 | 8/2001 | Kim | | 257/295 |
| 6,313,539 B1 | 11/2001 | Yokoyama et al. | | 257/761 |

FOREIGN PATENT DOCUMENTS

| | | |
|---|---|---|
| DE | 196 40 246 A1 | 4/1998 |
| EP | 0 793 274 A1 | 9/1997 |
| EP | 0837504 A2 | 4/1998 |
| WO | WO 98/05071 | 2/1998 |

OTHER PUBLICATIONS

Yamazaki, T. et al., "Advanced 0.5μm FRAM Device Technology with Full Compatibility of Half–Micron CMOS Logic device," IEEE, pp. 25.5.1–25.5.4, XP000855871, Dec. 1997.

* cited by examiner

*Primary Examiner*—Luan Thai
(74) *Attorney, Agent, or Firm*—Lisa K. Jorgenson; Robert Iannucci; Seed IP Law Group PLLC

(57) ABSTRACT

A contact structure for semiconductor devices which are integrated on a semiconductor layer is provided. The structure comprises at least one MOS device and at least one capacitor element where the contact is provided at an opening formed in an insulating layer which overlies at least in part the semiconductor layer. Further, the opening has its surface edges, walls and bottom coated with a metal layer and filled with an insulating layer.

20 Claims, 3 Drawing Sheets

CONTACT STRUCTURE FOR SEMICONDUCTOR DEVICES AND CORRESPONDING MANUFACTURING PROCESS

CROSS-REFERENCE TO RELATED APPLICATION

This application is a divisional of U.S. patent application Ser. No. 10/033,508 filed Dec. 28, 2001, now U.S. Pat. No. 6,541,808, which is a continuation of U.S. patent application Ser. No. 09/417,030, filed on Oct. 12, 1999, now abandoned.

BACKGROUND OF THE INVENTION

1. Field of the Invention

This invention relates to contacts for semiconductor devices, and specifically to contact structures for integrated semiconductor devices that include at least an MOS device and a capacitor element, and a corresponding manufacturing process.

2. Description of the Related Art

As is well known, ferroelectric devices, such as ferroelectric non-volatile memories, are acquiring growing importance in the field of integrated circuits on account of their low consumption and high operational and switching speed compared to conventional non-volatile memories. In particular, special attention is being devoted to forming these ferroelectric devices in combination with CMOS devices integrated on a semiconductor substrate.

A first prior technical solution for forming such ferroelectric devices and their contacts is described in an article "Advanced 0.5 um FRAM Device Technology with Full Compatibility of Half-Micron CMOS Logic Device" by Yamazachi et al., published in the proceedings of IEDM '97 Conference, Washington D.C., U.S.A., Dec. 7–10, 1997.

This prior solution for forming ferroelectric devices provides for following the integration of MOS devices such as MOS transistor, etc., on a semiconductor substrate with an insulating layer over the entire chip surface. The ferroelectric device, e.g., a ferroelectric memory is then formed above this insulating layer. Such device comprises conventionally a bottom electrode of metal laid onto the insulating layer.

A layer of a ferroelectric material covers the bottom electrode, and a top electrode of metal is provided on the ferroelectric layer.

After insulating the ferroelectric device by means of another insulating layer, the electric connection between the top electrode and the conduction terminals of the MOS device is established. Great care must be exerted in forming these contacts for electric connection between the ferroelectric devices and the underlying CMOS structures.

In this first prior solution, contact regions are provided for the device formed with CMOS technology by filling with tungsten (W-plug) openings in the insulating layer which overlies the control terminal.

The W-plug technique enables contacts to be defined with high aspect ratio, i.e. a high ratio of the contact depth to width, but is not easy to employ where the W-plugs are to be subjected to thermal treatments in an oxidizing environment during subsequent steps of the fabrication process. Such is the case with ferroelectric devices: the processing of the main ferroelectric materials indeed provides, following definition of the ferroelectric material, for the application of treatments at temperatures in the range of 500° to 850° C., in the presence of oxygen.

In that case, tungsten contacts should be sealed in by barrier layers, formed of non-standard materials, during the integrated circuit fabrication process to prevent the tungsten from giving rise to such volatile materials as $W_2O_5$ in the temperature range of 500° to 800° C. These temperatures are in fact temperatures used for the annealing and crystallization processes required to complete the ferroelectric devices.

Similar considerations apply to the instance of the contact regions being filled with polysilicon (polySi plugging) which will oxidize and become insulative once subjected to the thermal treatments involved in the crystallization of ferroelectric materials.

However, the introduction of such process steps for making these nonstandard barrier layers adds substantially to the complexity of the fabrication process.

It should be noted that according to the above reference, the interconnection of the CMOS technology device and the ferroelectric device is provided by a layer of titanium nitride (TiN) being indicated there as a local interconnection.

BRIEF SUMMARY OF THE INVENTION

Embodiments of this invention provide contacts which can be readily integrated to integrated circuits comprising electronic devices formed by MOS or CMOS processes, and having such structural and functional features as to afford improved integratability to these integrated electronic devices, thereby overcoming the limitations and/or the problems which beset prior art contacts for ferroelectric devices.

While its application to ferroelectric devices is specially advantageous, embodiments of the invention have a broad range of uses, it being possible to apply them to any devices wherein a contact of an oxidation-resistant material is to be substituted for a contact formed of a conductive material (W or PolySi plug). In particular, the invention can be applied to circuit structures including at least one component of the MOS or CMOS types and at least one capacitor element.

One of the concepts behind embodiments of this invention provides contacts for semiconductor devices comprising a coating with a barrier of a conductive material filled with an insulating material, this conductive coating is used to establish an electric connection between the bottom and top parts of the contact.

The features and advantages of a device according to the invention will be apparent from the following description of an embodiment thereof, to be read by way of non-limitative example in conjunction with the accompanying drawings.

BRIEF DESCRIPTION OF THE DRAWINGS

FIG. 1 is a cross-sectional view of a portion of a semiconductor substrate wherein a first embodiment of a circuit structure is integrated.

FIG. 2 is a cross-sectional view of a portion of a semiconductor substrate wherein a second embodiment of a circuit structure is integrated.

FIG. 3 is a diagram of a contact according to an embodiment of the invention.

FIG. 4 is a cross-sectional view, taken along line IV—IV, of the contact shown in FIG. 3.

FIG. 5 is a cross-sectional view of the circuit structure of FIG. 2 with a two layer conducting material.

DETAILED DESCRIPTION OF THE INVENTION

Referring to the drawing figures, generally, shown at 1 is a circuit structure which has been integrated on a semiconductor substrate 2 and comprises at least one device 3 formed with CMOS technology and connected to at least one capacitor element 4.

Figure 1:
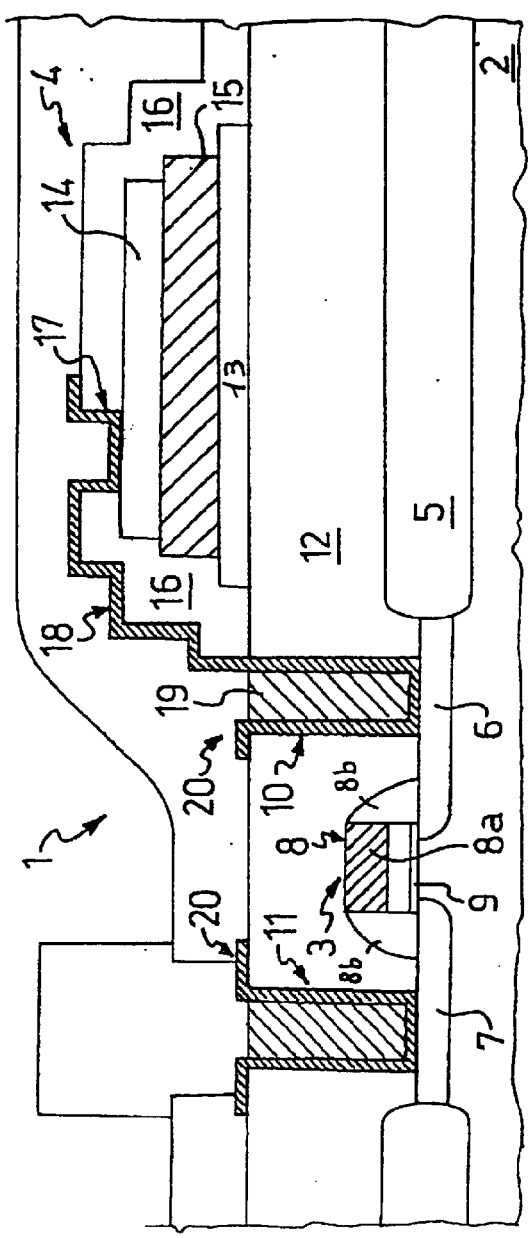

In the particular, in the embodiment shown in FIG. 1, a thick oxide layer 5 is formed selectively over the semiconductor substrate 2. The CMOS device 3, e.g., a MOS transistor, is formed in a portion of the substrate 2 not covered by the thick oxide 5. As ones skilled in the art will recognize, the MOS transistor 3 comprises a source region 6 and a drain region 7 which are both formed in the substrate 2 at a spacing from each other. These regions represent the conduction terminals of the transistor 3.

A (control) gate electrode 8 of polysilicon overlies the substrate region which extends between the source 6 and drain 7 regions, and is isolated from the surface of the substrate 2 by a thin oxide layer 9. The gate electrode 8 may be overlaid conventionally by layers of a conductive material 8a, such as silicide, and oxide spacers 8b may be provided at the electrode 8 sides for lateral protection.

An overlying insulating layer 12, e.g., of doped oxide with boron and phosphorus (BPSG), is then formed over the entire chip surface. A capacitor element 4 is next formed and comprises a bottom electrode 13 of a metal, e.g., platinum, laid onto the insulting layer. An intermediate layer 15 covers the bottom electrode 13, and a top electrode 14 of a metal, e.g., platinum, is laid onto the intermediate layer. The intermediate layer 15 may be an insulting layer, for example.

In a specially advantageous embodiment, the capacitor element 4 is a ferroelectric device, e.g., a memory, comprising a metallic bottom electrode 13 and top electrode 14, wherebetween an intermediate layer 15, e.g., of a ferroelectric material, is provided. This ferroelectric material may be PZT (PbZr$_{1-x}$,Ti$_x$O$_3$), a perovskite structure material.

Another insulating layer 16 is provided over the whole device 4. An opening 17 is formed in this layer 16 above and adjacent to the top electrode 14 of the device 4.

Openings 10 and 11 are formed in the overlying insulating layer 12, above and adjacent to the source 6 and drain 7 regions, respectively, for the making of contacts 20 according to embodiments of the invention.

A layer of a conducting material 18 is formed or deposited onto predetermined exposed areas of the circuit structure 1 to coat the side walls and the bottoms and upper edges of the openings 10 and 11. Advantageously, the layer 18 covers at least part of a portion of the insulting layer 12 which surrounds the entrances to the openings 10 and 11. In addition, this layer of conducting material 18 is provided over the source region 6 and also coats the opening 17 to establish the electric connection between the transistor 3 and the device 4.

Figure 4:
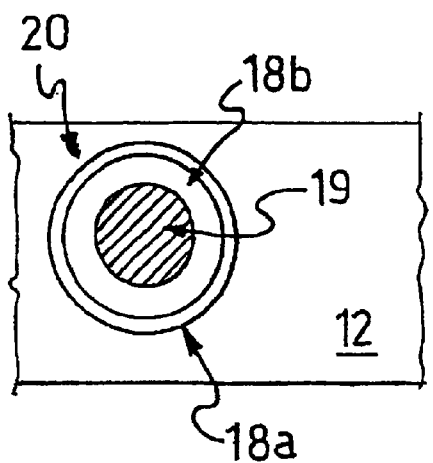
Figure 3:
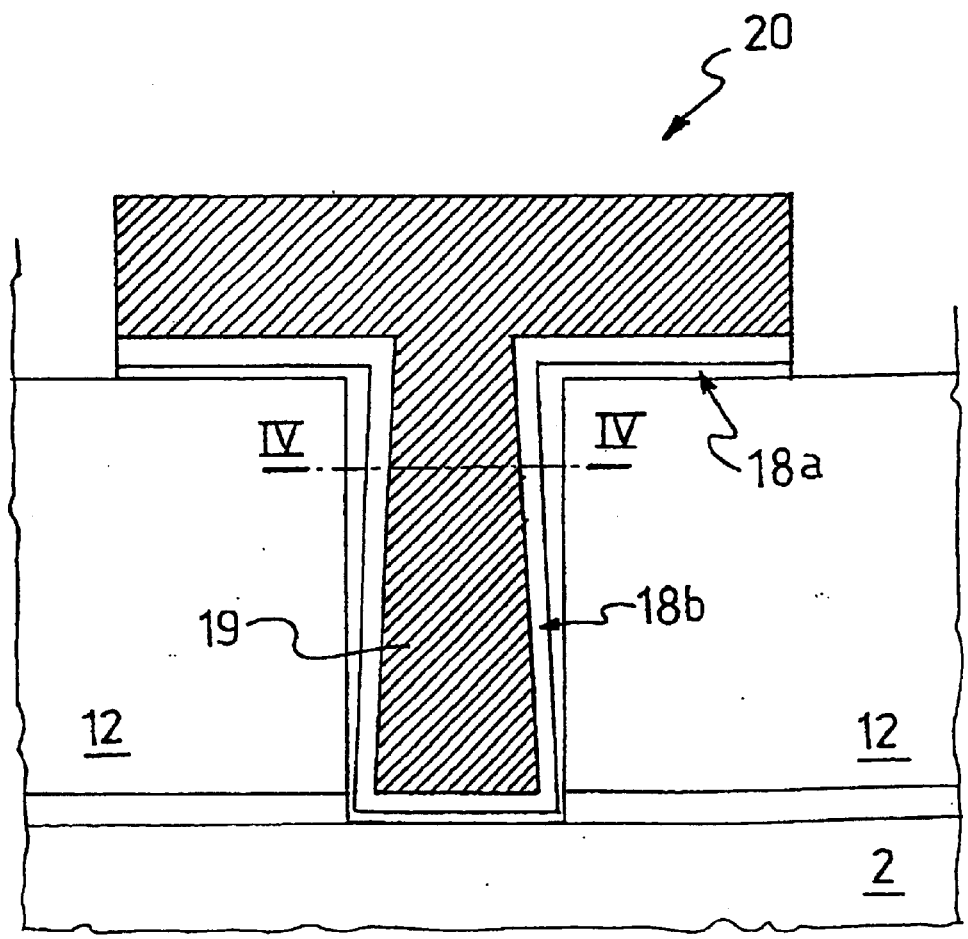

This layer of conducting material 18 may be, for example, either titanium or titanium nitride, or may comprise a first layer of titanium 18a and a second layer of titanium nitride 18b as shown in FIGS. 3 and 4. The layer of conducting material 18 may also be a metal layer that is resistant to Oxygen, such as RuO$_2$ (Ruthenium Oxide), or I$_2$O$_2$ (Iridium Oxide).

An insulating fill layer 19 is then formed selectively in the openings 10, 11. This insulating fill layer 19, e.g., of tetraethylorthosilane (TEOS), is deposited by a plasma-enhanced chemical vapor deposition (PECVD). Alternatively, the insulating fill layer 19 could be deposited by a high density plasma chemical vapor deposition (HDPCVD), or any other suitable process.

The formation of the contacts 20 of this embodiment of the invention is then completed by a process, such as an etch-back by anisotropic plasma etching or a chemical mechanical polishing (CMP) process, for planarizing the oxide layer outside the contacts 20.

Alternatively, the insulating fill layer 19 could be undoped oxide (USG) or boron and phosphorus doped oxide (BPSG).

In essence, each contact 20 of this embodiment is as if it were an oxide plug 19 "coated" with a barrier of conductive titanium/titanium nitride layers, providing electric contact between the silicon substrate (contact bottom) and the upper metallization layers (contact top).

As stated above, FIGS. 3 and 4 focus on the contact as made by the embodiment described above. FIG. 3 shows the opening made in the insulating layer 12. A first layer of titanium 18a is overlaid by a layer of titanium nitride 18b. The insulating layer 19 then fills the opening. FIG. 4 is a cross section of FIG. 3 located at the IV—IV lines, and shows the relative thickness' of the different layers making the contact.

Figure 2:
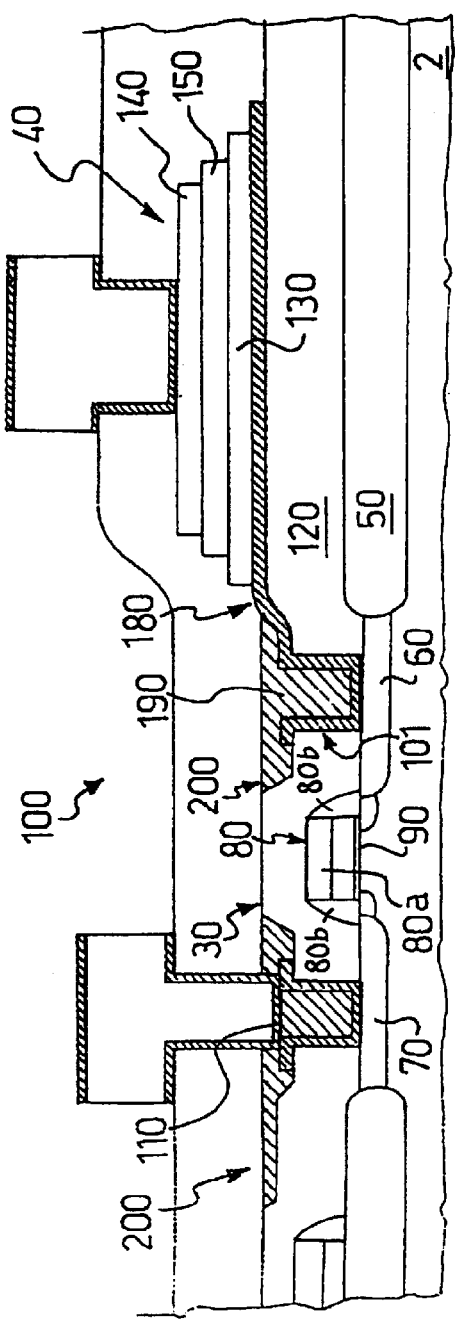

A second embodiment is shown in FIG. 2 wherein the numeral 100 denotes a circuit structure which has been integrated on a semiconductor substrate 2 and comprises at least one device formed with CMOS technology 30 and connected to at least one capacitor element 40.

Formed in a portion of the substrate 2 not covered by a thick oxide layer 50 is a CMOS device 30, e.g., a MOS transistor.

As ones skilled in the art will recognize, the MOS transistor 30 includes a source region 60 and a drain region 70 having a second type of conductivity, which regions are formed in the substrate 2 at a spacing from each other. These regions represent the conduction terminals of the transistor 30.

A (control) gate electrode 80 of polysilicon, extending between the source 60 and drain 70 regions, is projecting from the substrate 2 surface and is isolated therefrom by a thin oxide layer 90.

The gate electrode 80 may conventionally be overlaid by layers of a conductive material 80a, such as silicide, and oxide spacers 80b may be provided at the electrode 80 sides for lateral protection. An overlying insulating layer 120 is then formed over the entire chip surface. Advantageously, the overlying insulating layer 120 is TEOS. In this way, the layer 120 can be of an even thickness over non-horizontal surfaces as well.

Formed in the dielectric layer 120, above and adjacent to the source 60 and drain 70 regions, are respective openings 101 and 110 for providing the contacts 200 of this invention.

A layer of a conducting material 180 is then deposited onto the side walls and the bottoms of the openings 101, 110 and onto the upper edges of the openings 101 and 110, to cover at least in part a portion of the overlying insulating layer 120 around these openings.

Figure 5:
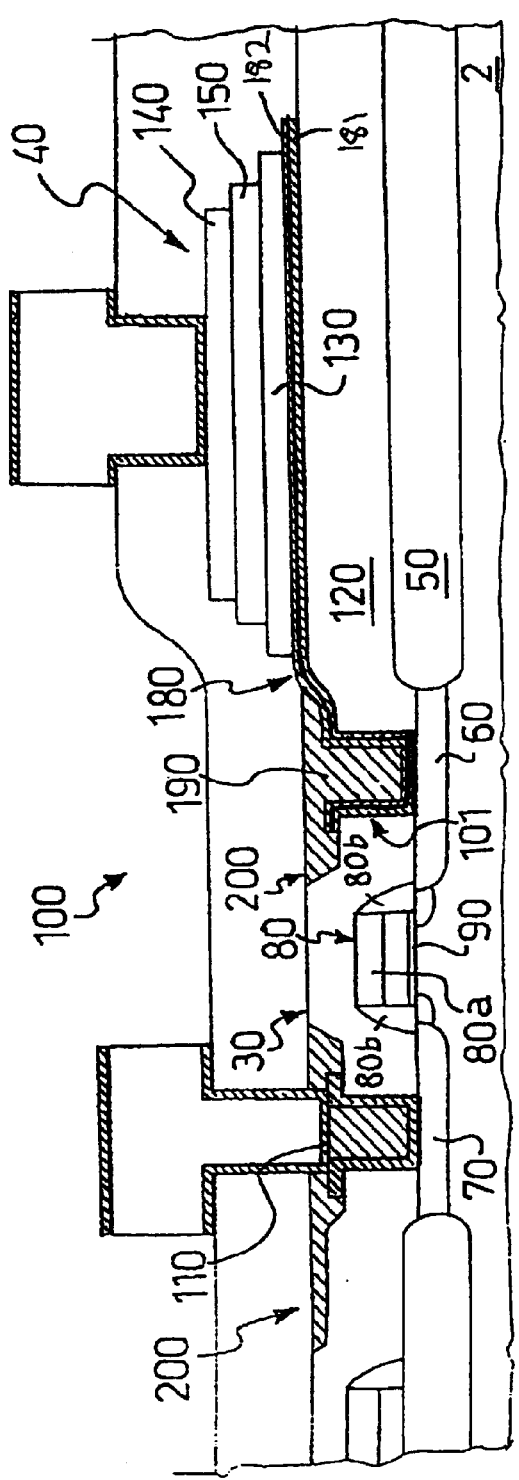

This layer of conductive material 180 provided on the source region 60 is formed over a portion of the overlying insulating layer 120, where the ferroelectric device 40 will be formed. The layer of conducting material 180 may comprise a first layer 181 of titanium and a second layer 182 of titanium nitride as shown in FIG. 5. The layer of conducting material 180 may also be a metal layer that is resistant to Oxygen, such as RuO$_2$ (Ruthenium Oxide), or I$_2$O$_2$ (Iridium Oxide).

An insulating fill layer 190 is then deposited selectively in the openings 101 and 110.

Thereafter, the capacitor element 40 is formed and includes a bottom electrode 130, e.g., of platinum, laid onto the conductive layer 180. A top electrode 140, e.g., of platinum, is laid onto the bottom electrode 130 with the interposition of at least one intermediate layer 150. The intermediate layer 150 may be an insulating layer, for example.

In a specially advantageous embodiment, the capacitor element 40 is a ferroelectric device, e.g., a memory comprising a metallic bottom electrode 130 and metallic top electrode 140, wherebetween an intermediate layer 150, e.g., of a ferroelectric material, is formed. This ferroelectric material may be PZT ($PbZr_{1-x},Ti_xO_3$).

Another insulating layer 160, e.g., of TEOS, is formed over the entire chip surface wherein contacts 210 for connection to upper metallization layers are provided.

The formation of the contacts 200 of this embodiment is then completed by a process, such as an etch-back by anisotropic plasma etching or a chemical mechanical polishing (CMP) process, for planarizing the oxide layer outside the contacts 200.

In summary, the formation of contacts of this invention removes the need for using materials, such as polysilicon or tungsten, which exhibit low resistance to thermal processes in an oxidizing environment. Such thermal processes are required, for example, to form devices comprising ferroelectric layers, or shielding barriers from oxidizing species for these materials, thereby greatly simplifying the process steps for manufacturing the devices.

Although the foregoing description has been given in relation to strapped structures wherein the capacitor element is formed at the field oxide, all the advantages of the invention can also be secured for stacked structures wherein the capacitor element is formed at the source region of the MOS device.

What is claimed is:

1. A process for manufacturing a contact circuit structure, comprising:
    forming a MOS device having conduction terminals formed in a semiconductor layer and an overlying control terminal covered with an overlying insulating layer;
    forming a capacitor element above said overlying insulating layer and comprising a bottom electrode and a top electrode;
    forming contact openings through the overlying insulating layer overlying the MOS device;
    coating surface edges, walls and bottoms of said contact openings with a metal layer having a top surface;
    filling the contact openings with an insulating fill material; and
    planarizing the insulating fill material such that the planarizing insulating fill material has a top surface that does not extend above the top surface of the metal layer.

2. The manufacturing process according to claim 1 wherein said insulating fill material is TEOS.

3. The manufacturing process according to claim 2, wherein the TEOS insulating fill material is deposited by a plasma enhanced chemical vapor deposition technique.

4. The manufacturing process according to claim 2, wherein the TEOS insulating fill material is deposited by a high density plasma chemical vapor deposition technique.

5. The manufacturing process according to claim 1, wherein the metal layer is also deposited, beyond entrances to the openings, over the overlying insulating layer.

6. The manufacturing process according to claim 1, wherein said metal layer comprises a layer of titanium.

7. The manufacturing process according to claim 1, wherein said metal layer comprises a layer of titanium nitride.

8. The manufacturing process according to claim 1, wherein the capacitor element is formed after planarizing the insulating fill material.

9. The manufacturing process according to claim 1, wherein the overlying insulating layer is a first overlying insulating layer, the process further comprising:
    forming a second overlying insulating layer overlying the first overlying insulating layer, the metal layer, and the insulating fill material; and
    forming a stacked metal contact that extends through the second overlying insulating layer and contacts the metal layer and insulating fill material that were formed in one of the contact openings.

10. A process for manufacturing a contact circuit structure, comprising:
    forming a MOS device having conduction terminals formed in a semiconductor layer and an overlying control terminal covered with an overlying insulating layer;
    forming a contact opening through the overlying insulation layer overlying the MOS device;
    coating a wall and bottom of the contact opening with a metal layer;
    filling the contact opening with an insulating fill material;
    planarizing the insulating fill material; and
    forming a capacitor element above the overlying insulating layer after planarizing the insulating fill material, the capacitor element being coupled to one of the conduction terminals of the MOS device.

11. The manufacturing process according to claim 10, wherein said insulating fill material is TEOS.

12. The manufacturing process according to claim 10, wherein the metal layer is also deposited, beyond an entrance to the opening, over the overlying insulating layer.

13. The manufacturing process according to claim 10, wherein said metal layer comprises a layer of titanium.

14. The manufacturing process according to claim 13, wherein said metal layer comprises a layer of titanium nitride.

15. The manufacturing process according to claim 10, wherein the overlying insulating layer is a first overlying insulating layer, the process further comprising:
    forming a second overlying insulating layer overlying the first overlying insulating layer, the metal layer, and the insulating fill material; and
    forming a stacked metal contact that extends through the second overlying insulating layer and contacts the metal layer and insulating fill material that were formed in the contact opening.

16. A process for manufacturing a contact circuit structure, comprising:
    forming a MOS device having first and second conduction terminals formed in a semiconductor layer and an overlying control terminal covered with a first insulating layer;
    forming a capacitor element above the first insulating layer;
    coupling the capacitor element to the first conduction terminal;
    forming a first contact that extends through a first opening in the first insulating layer, the second contact including a first metal layer that coats surface walls of the first opening and contacts the second conduction terminal;

filling the first opening with an insulating fill layer that is laterally surrounded by the first metal layer, and forming a second contact directly above the first contact and in contact with the first metal and insulating fill layers of the first contact.

17. The manufacturing process according to claim 16, further comprising forming a second insulating layer that covers the first insulating layer, capacitive element, and first contact, wherein forming the second contact includes forming a second opening through the second insulating layer and coating walls of the second opening with a second metal layer that contacts the insulating fill layer and the first metal layer of the first contact.

18. The manufacturing process according to claim 16, further comprising planarizing the insulating fill material prior to forming the second contact.

19. The manufacturing process according to claim 16, wherein coupling the capacitor element to the first conductive terminal includes forming a third contact that extends through a second opening in the first insulating layer, the third contact including a second metal layer that coats a sidewall and bottom of the second opening, extends beyond the second opening, and contacts a bottom surface of a bottom electrode of the capacitive element.

20. The manufacturing process according to claim 16, wherein coupling the capacitor element to the first conductive terminal includes forming a third contact that extends through a second opening in the first insulating layer, the third contact including a second metal layer that coats a sidewall and bottom of the second opening, extends beyond the second opening, and contacts a top surface of a top electrode of the capacitive element.

\* \* \* \* \*